United States Patent [19]
Wilbur

[11] Patent Number: 6,020,794
[45] Date of Patent: Feb. 1, 2000

[54] RATIOMETRIC AUTOTUNING ALGORITHM FOR RF PLASMA GENERATOR

[75] Inventor: Joseph Wilbur, Rochester, N.Y.

[73] Assignee: ENI Technologies, Inc., Rochester, N.Y.

[21] Appl. No.: 09/020,835

[22] Filed: Feb. 9, 1998

[51] Int. Cl.[7] ...................................................... H03H 7/00
[52] U.S. Cl. .......................................... 333/17.1; 333/17.3
[58] Field of Search .................................. 333/17.1, 17.3; 315/111.21; 118/723 R, 723 MW; 204/298.31, 298.38; 156/345

[56] References Cited

U.S. PATENT DOCUMENTS

| | | | |
|---|---|---|---|
| 4,375,051 | 2/1983 | Theall ..................................... | 333/17.3 |
| 4,679,007 | 7/1987 | Reese et al. ............................ | 333/17.3 |
| 5,441,596 | 8/1995 | Nulty ..................................... | 156/643.1 |
| 5,688,357 | 11/1997 | Hanawa .................................. | 156/345 |

*Primary Examiner*—Paul Gensler
*Attorney, Agent, or Firm*—Bryan Cave LLP

[57] ABSTRACT

An RF plasma system employs frequency tuning to change the frequency of an RF generator within a frequency range to match the impedance of a plasma chamber. Forward power and reflected power magnitudes are obtained from a bidirectional sensor. The ratio of reflected power to forward power is obtained for one frequency, and then the frequency is changed. The tuning algorithm compares the ratio of reflected to forward power at the new frequency with the ratio obtained earlier. If this ratio is smaller, the frequency is changed again in the same direction, but if larger, then the frequency is changed in the other direction. These steps are iterated until the ratio of reflected to forward power reaches a minimum. The tuning algorithm can be implemented in hardware or in software.

12 Claims, 5 Drawing Sheets

RATIOMETRIC AUTOTUNING ALGORITHM FOR RF PLASMA GENERATOR

BACKGROUND OF THE INVENTION

This invention relates to plasma generation equipment and techniques, and is particularly directed to automatic tuning of an RF plasma system to match the impedance of a reactive plasma chamber or similar non-linear load to the output of an RF generator or similar RF source. The invention is more particularly concerned with a frequency technique that automatically changes the frequency of an RF generator until it reaches an optimum frequency at which the RF plasma system is tuned.

In a typical RF plasma generator arrangement, a high power RF source produces an RF wave at a given frequency, e.g., 13.56 MHz, and this is furnished along a power conduit to a plasma chamber. The RF power is also typically provided at a fixed, known impedance, e.g., 50 ohms. Because a severe impedance mismatch is typically present between the RF power source and the plasma chamber, some provision must be made for matching the impedance of the plasma chamber to the impedance of the source. In a fixed-frequency RF system, an impedance matching network is interposed between the two. An error detector measures the magnitude error, i.e., the difference between the magnitude of the nominal input impedance (typically 50Ω and the magnitude of the actual input impedance, and measures the phase error, i.e., the deviation between the phase at the nominal input impedance (typically zero degrees) and the phase at the actual input impedance. The movement of one or more variable impedance devices, used as tuning elements, is governed by the magnitude error signal and the phase error signal. This arrangement can experience long delays in reaching the tuning point, or can experience a "lost" condition where the tuning elements do not seek the tuning point, or may drive the tuning elements away from the tuning point.

Another attractive approach is the frequency tuning technique, in which the frequency of the RF generator is changed until the impedance of the RF plasma chamber matches it as closely as possible. The frequency tuning method has the benefit of not requiring moving parts, and (in theory) achieving a rapid arrival at the optimal tuning point.

With frequency tuning, there is only a single point of control, to wit, frequency. This means that, unlike a mechanically tuned match network, which has at least two variable tuning elements, and can employ three or more, it is possible to achieve perfect tuning with a single load impedance. As a result, frequency tuning is much faster and is mechanically more reliable, as it requires no moving parts. On the other hand, frequency tuning has not been able to achieve the nearly ideal impedance match that a mechanically tuned matching network has achieved.

A typical frequency tuning method operates as follows: The generator is turned on, with its frequency at a starting point within the RF range. The generator supplies forward or applied power to the plasma chamber. A portion of the applied power is reflected back towards the generator. The reflected power is measured, and the magnitude of reflected power is stored in memory. Then the RF frequency is changed in one direction. The reflected power is measured again, and compared with the stored magnitude from the previous measurement. Based on the change in reflected power, the frequency is moved again: if there is a decrease in reflected power, the frequency is moved in the same direction; if there is an increase in reflected power, then the frequency is moved in the opposite direction. This is continued until the lowest possible reflected power is achieved.

A problem arises with this method, because the tuning decision is based solely upon changes in reflected power. The main form of protection for the RF generator involves limiting the RF generator's output power as the load VSWR (voltage standing wave ratio) increases. By limiting the RF output power, the applied power is kept low enough so that the reflected power does not climb above a predetermined threshold. This does not mean that the forward (applied) power is at that same level. When a special limiting condition exists such that the VSWR is high, but not infinite, and the requested power is such that the reflected power is at a maximum level, the existing design for RF tuning cannot detect any change in the reflected power, and cannot effect impedance matching of the generator to the load as the frequency varies. That is, the reflected power is flat across a large part of the frequency range, and the tuning becomes lost.

Another problem that arises is the difficulty in tuning consistently, quickly, and reliably with any requested generator RF output level. In the conventional frequency tuning technique, there is a reverse power threshold that must be changed manually, depending on the requested generator output power range, and on other plasma chamber conditions that affect the VSWR. This creates difficulty in maintaining consistency and reliability from system to system.

In order to avoid the above-mentioned lost tuning condition, the conventional approach has included waiting some predetermined amount of time for the system to tune, and then if tuning has not been achieved, snapping the generator frequency to some predefined point. This works, of course, only if the predefined frequency point is one that will provide a reasonable impedance match for the current plasma chamber conditions, and this may not be the case.

Another previous approach has involved detecting a high reflected power condition and then after some predetermined amount of time quickly scanning the frequency band to look for a better impedance match. However, this solution can be counter-productive, as the algorithm may have been changing frequency in the correct direction when this happens. Thus, this previously proposed solution may result in an oscillatory condition that prevents an acceptable match altogether.

As to the second problem mentioned above, the current approach involves a compromise technique. This compromise is necessary in systems where the best VSWR is relatively high. In such a case, it is required to allow the RF generator to accept a relatively high reflected power as its final tune point. If the requested RF power is also high, this can pose a serious problem that could result in damage to the RF generator. However, if the requested RF power is reduced, there is an increased possibility that the system will settle into a poor impedance match rather than the ideal impedance match.

No one has previously attempted to control the tuning of the RF generator on any basis other than the reflected power alone, and no one has previously appreciated that consideration of the forward or applied power could help resolve the above-mentioned problems.

OBJECTS AND SUMMARY OF THE INVENTION

It is an object of this invention to provide a scheme for controlling the tuning of an RF plasma generator that avoids the drawbacks of the prior art.

It is another object of this invention to provide automatic tuning of an RF plasma system that avoids lost tuning condition and achieves rapid tuning even under high VSWR or high applied power conditions.

According to an aspect of this invention, an automatic frequency tuning method optimally tunes an RF generator to match the plasma impedance. The RF generator applies RF power at a frequency in an RF range to a plasma chamber, and the plasma chamber reflects a portion of the applied RF power as reflected power. At the ideal tuning point, the amount of the forward power that is reflected back is at a minimum. The method involves the steps of sensing the applied RF power furnished from the generator to the plasma chamber; sensing the reflected RF power that is reflected back to the generator from the chamber; measuring the ratio of magnitudes of applied and reflected power at that frequency; and adjusting the frequency of the generator in the direction to maximize the ratio of applied power to reflected power. These steps are iterated until the optimal tuning point is reached, i.e., where the ratio of reflected to forward power, as a function of RF frequency, is at a minimum.

The tuning decision can be based upon the ratio of the reflected power to the forward power, or on the reflection coefficient which is calculated as the square root of the ratio of the reflected power to the applied power. The tuning decision can be based on the voltage standing wave ratio, or VSWR, which is equal to (VSWR)=(RC−1)/(RC+1), where RC is the reflection coefficient. In a general sense, the tuning decision can be based on any relationship that exists between a predetermined electrical parameter of the applied power and a predetermined electrical parameter of the reflected power, such that said relationship varies as a function of frequency and has a minimum (or maximum) value at an optimal tuning point in the RF range.

The invention can be easily extended to apply to any system in which the load impedance varies with the frequency of applied power, and which is to be tuned to an optimal point.

The above and many other objects, features, and advantages of this invention will become apparent from the ensuing description of a preferred embodiment, which is to be read in conjunction with the accompanying Drawing.

DETAILED DESCRIPTION OF THE PREFERRED EMBODIMENT

Figure 1:
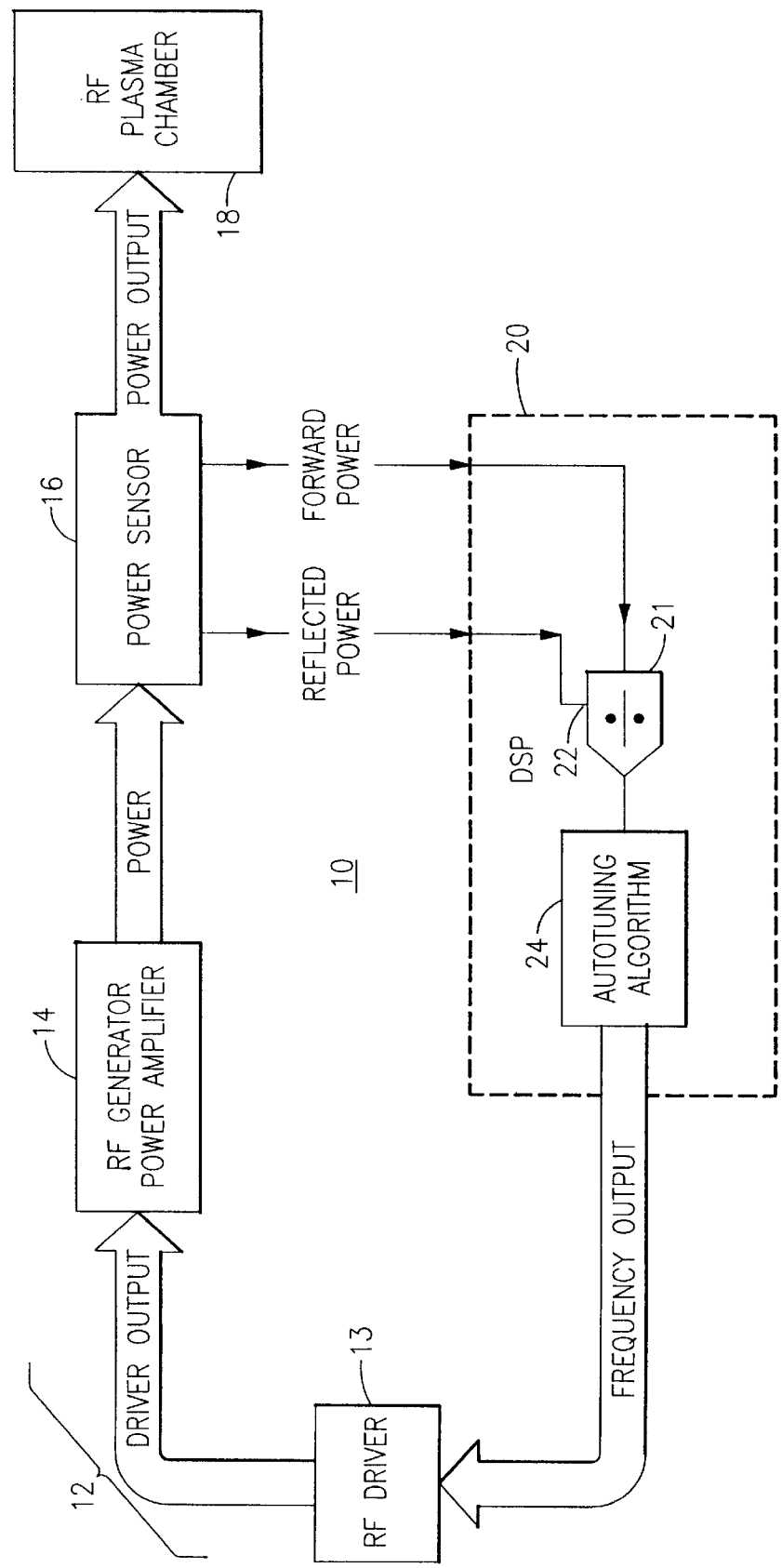
FIG. 1 is a system block diagram of an RF plasma process incorporating frequency control according to one embodiment of this invention.

With reference to the Drawing figures, and initially to FIG. 1, an RF plasma processing system 10 is shown for purposes of example. A plasma generator 12 provides RF electrical power at a frequency, within a range, e.g., from 1.8 to 2.2 MHz. The generator 12 is formed of a controllable RF driver 13 followed by an RF power amplifier 14. The amplifier supplies forward RF power through bidirectional sensor system 16, e.g., a bidirectional coupler, to an input of a plasma chamber 18. The sensor 16 provides a reading of forward or applied power, and also a reading of reflected power i.e., power that is rejected from the plasma chamber 18 and sent back towards the generator 12.

A digital signal processor or DSP 20 has inputs to receive the forward power level and the reverse or reflected power level, and has memory locations 21, 22 for respectively storing digitized values corresponding to the forward power and reflected power. A stored autotuning algorithm 24 computes the value of a function, such as the ratio of reflected power to applied power, based on the values stored in the memory locations, and then instructs the DSP 20 to signal the RF driver 13 to change its frequency by some step value. The tuning algorithm 24 can be implemented as microcode stored in the DSP, or can be implemented as hardware. The algorithm 24 reiterates the above steps of storing forward and reflected power values, computing and evaluating the power ratio (or other parameter), and adjusting the tuning of the driver 13 until the lowest value of the power ratio is reached.

Figure 2:
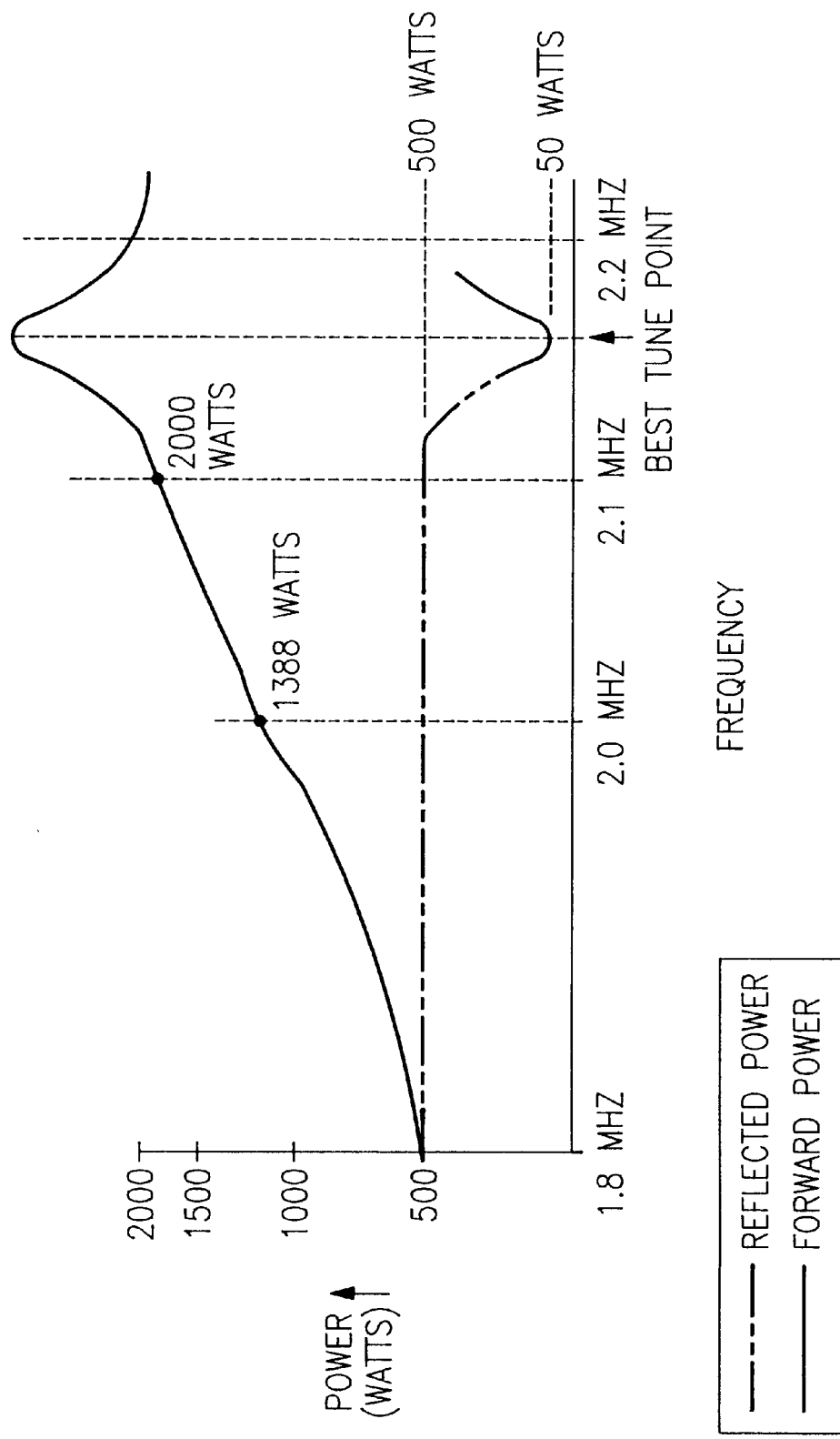
FIG. 2 is a chart showing forward and reflected power characteristics over a range of frequencies for the system of FIG. 1 under a given set of conditions.

An example of the forward and reflected power characteristics of a frequency-tuned RF plasma system is shown in the chart of FIG. 2. This will illustrate the problems that arise when the tuning decision is based only on the reflected power. In this Example, the frequency band for the generator 12 is from 1.8 MHz to 2.2 MHz, and the generator has a maximum allowable reflected power of 500 watts. This limits the output power of the amplifier 14 over this range so that the reflected power stays at or below this level. The complex impedance of an R-L-C network, which represents a typical plasma impedance, exhibits a VSWR of 4:1 at 2.0 MHz and a VSWR of 3:1 at 2.1 MHz. The amplifier 14 has a generator power set point of 2500 watts.

In this example, the reflected power is at its limit over most of the range, and does not drop below its limit until the generator frequency is in the near neighborhood of the tuning point. The magnitude of reflected power does not drop below 500 watts despite changes in frequency. This results in the generator's frequency tuning algorithm becoming lost, and can hunt for the tuning point without leaving the flat portion of the reflected power curve.

Figure 3:
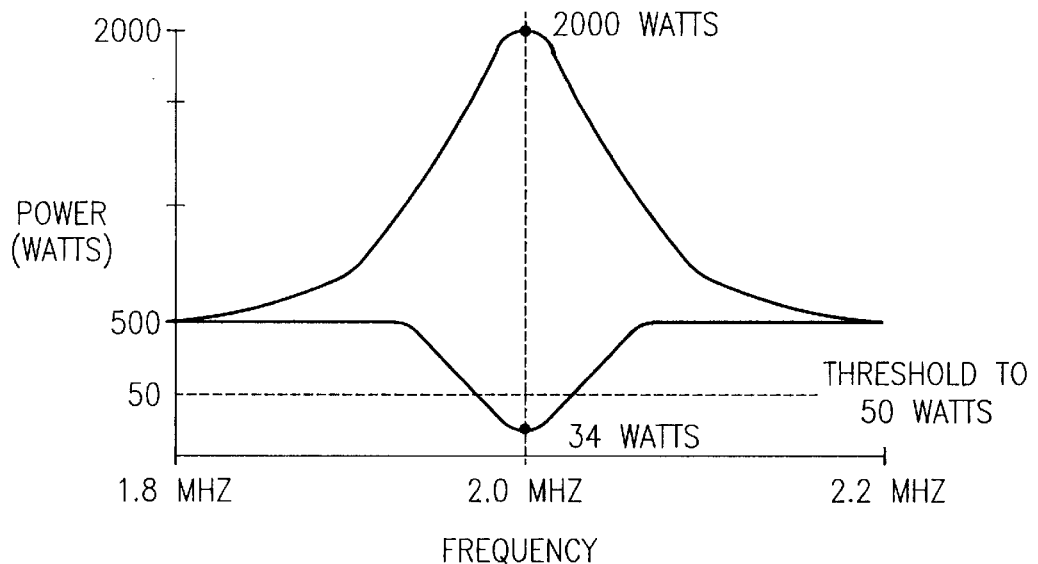
FIGS. 3 and 4 are charts showing forward and reflected power characteristics over the range of frequencies under other conditions.
Figure 4:
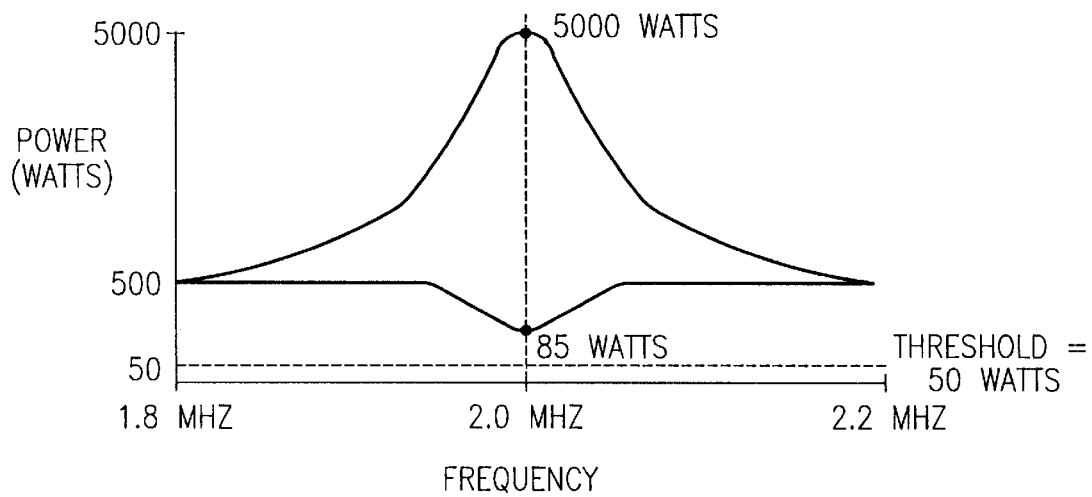

FIG. 3 is a chart of reflected and forward power characteristics over this same range of 1.8 to 2.2 MHz, for an example wherein the RF reflected power threshold is manually changed depending on the requested generator output power. Here, the requested forward power is set at 2000 watts, and the manually set threshold (represented by the dash line) is set at 50 watts. In ideal conditions, the reflected power at the tuning point is significantly below this threshold. In this example, the system has a tune point at 2.0 MHz, at a VSWR of 1.3:1, so that the forward power $P_F$ is nearly 2000 watts, and the reflected power $P_R$ is about 34 watts. However, under similar conditions as illustrated in FIG. 4, if the power set point is 5000 watts, the reflected power $P_R$ will be about 85 watts at the tuning point when the forward power $P_F$ is about 5000 watts. In this case, the reverse power never descends below the threshold of 50 watts over the entire range, and the reflected-power based algorithm has no way of detecting when the generator has reached the tuning point.

Figure 5:
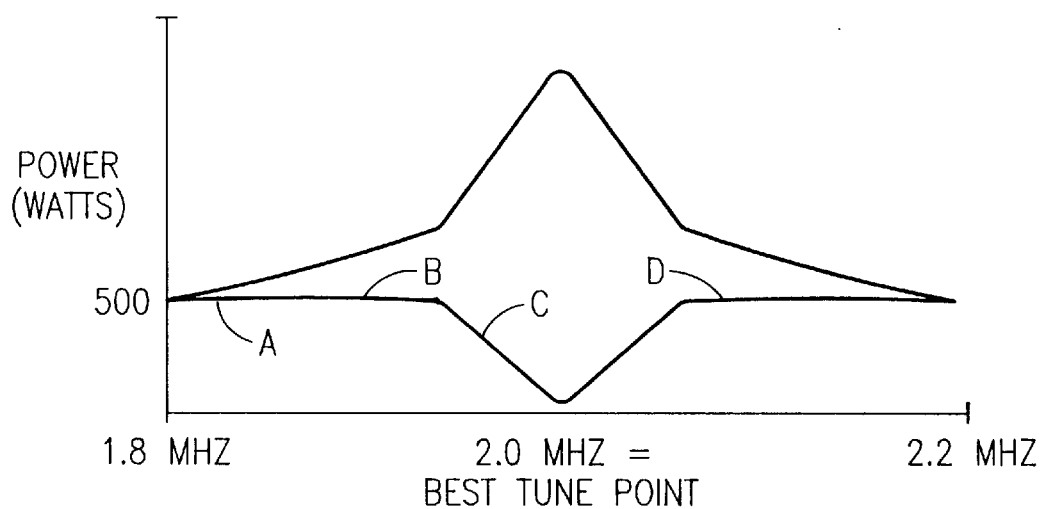
FIG. 5 is another chart showing forward and reflected power characteristics.

The frequency-scanning proposal discussed previously can be explained with reference to the forward power/ reflected power chart of FIG. 5. Here, assuming that the generator initially provides power near the low end of the frequency band, i.e., just above 1.8 MHz at point A, the reflected-power based algorithm moves the RF frequency from point A to a higher frequency, here point B. Because the reflected power at point B is still high, and is unchanged from point A, the existing tuning algorithm will not allow the system to stop tuning. However, because of small amounts of noise, or very small variations in reflected power, e.g., in the vicinity of one watt or below, the algorithm can easily take a wrong turn and become lost. That is, the current algorithm may continue to hunt between points A and B, and never reach point C, which here represents the sloping part of the reflected power characteristic. As mentioned before, one approach to this has been to institute a frequency jump to some predetermined point, from which the tuning process can (hopefully) continue successfully. As long as the frequency jump is to a location such as point C, the tuning algorithm can make intelligent decisions concerning frequency tuning, because the point C is on the slope that leads to the minimum, or best tuning point (here, 2.0 MHz). However, the best tuning point is not known in advance, and it is likely that the jump could lead to a point D, which is not on the sloping part of the reflected power characteristic. In that case, the algorithm is still lost, and is as likely as not to steer the generator away from the optimal tuning point.

Figure 6:
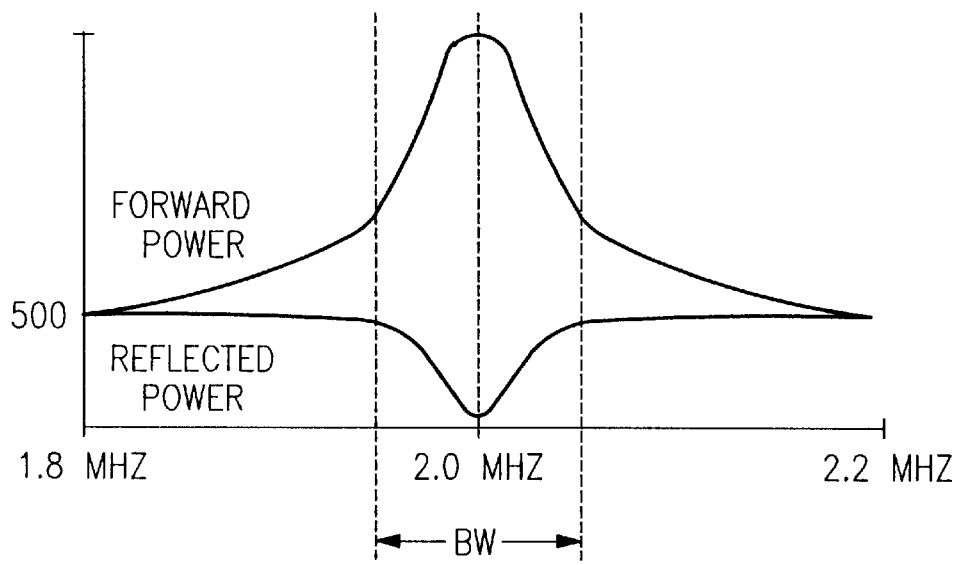
FIG. 6 is a chart showing forward and reflected power characteristics for explaining the frequency tuning algorithm of this invention.
Figure 7:
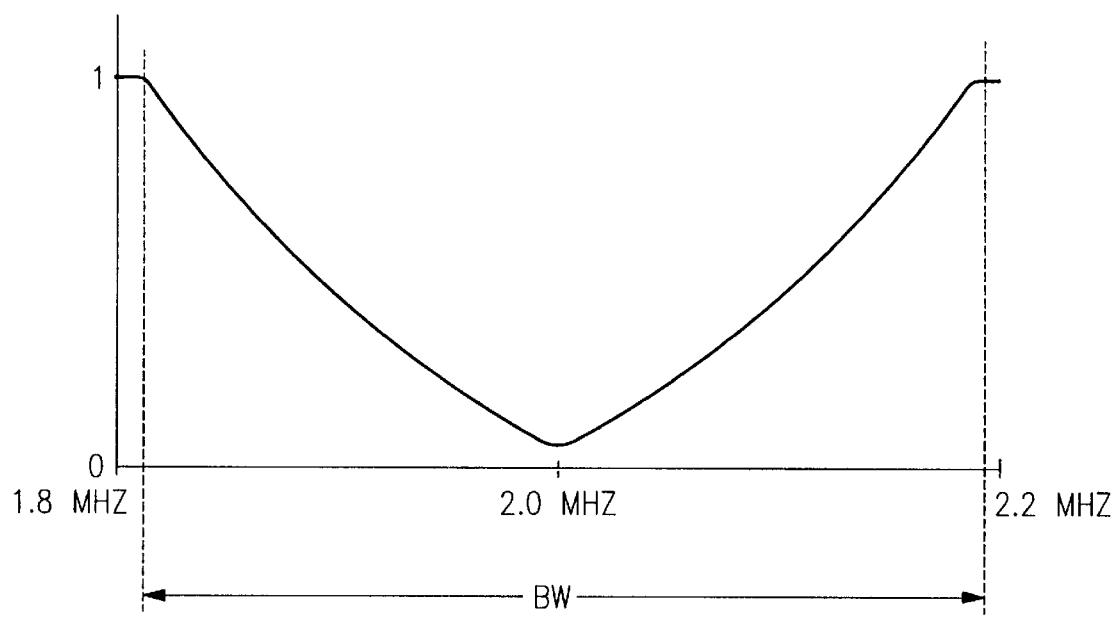
FIG. 7 is a chart of the ratiometric characteristic of reflected power to forward power across the frequency range.

An example of the tuning algorithm of this invention can be explained with reference to FIGS. 6 and 7. As illustrated in FIG. 6, as long as the frequency is some distance from the tuning point, the reflected power will be generally flat, even though the applied or forward power increases (or decreases). There is a small band width BW around the optimum tuning point where the reflected-power-only algorithm can make intelligent decisions about frequency tuning. On the other hand, it can be readily observed that the relative sizes of the forward and reflected power change rather significantly over the range. In fact, where both the forward power $P_F$ and the reflected power $P_R$ are considered, the ratio $P_R/P_F$ will have a useful slope over the entire frequency band of 1.8 to 2.2 MHz (in this example), which increases the useful tuning bandwidth BW as shown. Where the ratio $P_R/P_F$ is used, the algorithm 24 can make intelligent tuning decisions, as there is a significant slope over nearly this entire range.

Alternatively, rather than the ratio $P_R/P_F$ as mentioned above, the algorithm can base its tuning decision on other possible relationships of the reflected or reverse power to the forward or applied power. The algorithm can be written to minimize some form of ratio of reflected to forward power, or equivalently, to maximize some ratio of forward power to reflected power. For example, the generator forward power is automatically adjusted to keep the reflected power at or below a given safety level, e.g., 500 watts, as discussed in reference to FIGS. 2, 3, and 4. As shown in those views, forward power increases as the frequency approaches the tuning point. Thus, applied power or forward power can be used as a criterion for autotuning, at least for those frequencies where the reflected power curve is flat.

The autotuning algorithm can be implemented fully or partially in hardware, in which case it is possible to omit the DSP or microprocessor. It is also possible that the calculations of the $P_R/P_F$ ratio to be made in hardware, while decisions to alter frequency are made within a DSP or microprocessor. Also, the invention also applies where there is a continuous sweep of frequencies during tuning, rather than stepwise frequency changes.

While the invention has been described above in respect to an embodiment of the invention, it should be understood that the invention is not limited to that precise embodiment. Rather, many modifications and variations will present themselves to persons skilled in the art without departure from the scope and spirit of the invention, which is defined in the appended claims.

I claim:

1. Method of optimally tuning an RF generator to produce a plasma, wherein the RF generator applies RF power at a frequency in an RF range to a plasma chamber, wherein the plasma chamber reflects a portion of said applied RF power, comprising the steps of:

sensing the applied RF power furnished from said generator to the plasma chamber;

sensing the reflected RF power that is reflected back to said generator from said chamber;

measuring the ratio of magnitudes of said applied and reflected power at said frequency;

adjusting the frequency of the generator in the direction to maximize the ratio of applied power to reflected power.

2. The method of claim 1, wherein said step of sensing said applied RF power comprises the step of sensing said reflected RF power substantially simultaneously with said step of sensing said applied RF power.

3. Method of optimally tuning an RF generator to produce a plasma, wherein the generator applies RF power at a frequency in an RF range to a plasma chamber, wherein the plasma chamber reflects a portion of said applied RF power, comprising the steps of:

sensing the applied RF power furnished from said generator to the plasma chamber;

sensing the reflected RF power that is reflected back to said generator from said chamber;

measuring the magnitudes of said applied and reflected power at said frequency;

calculating a reflection coefficient at said frequency as a function of the magnitudes of reflected power and applied power; and adjusting the frequency of the generator in the direction to minimize the reflection coefficient.

4. Method of optimally tuning an RF generator according to claim 3, said reflection coefficient is calculated as the square root of the ratio of the reflected power to the applied power.

5. The method of claim 3, wherein said step of sensing said applied RF power comprises the step of sensing said reflected RF power substantially simultaneously with said step of sensing of said applied RF power.

6. Method of optimally tuning an RF generator to produce a plasma, wherein the generator applies RF power at a frequency in an RF range to a plasma chamber, wherein the plasma chamber reflects a portion of said applied RF power, comprising the steps of:

sensing the applied RF power furnished from said generator to the plasma chamber;

sensing the reflected RF power that is reflected back to said generator from said chamber;

measuring the magnitudes of said applied and reflected power at said frequency;

calculating a voltage standing wave ratio as a function of the magnitudes of the applied power and the reflected power; and adjusting the frequency of the generator in the direction to minimize the voltage standing wave ratio.

7. The method of claim 6, wherein said step of sensing said applied RF power comprises the step of sensing said reflected RF power substantially simultaneously with said step of sensing of said applied RF power.

8. Method of optimally tuning an RF generator to produce a plasma, wherein the generator applies RF power at a frequency in an RF range to a plasma chamber, wherein the plasma chamber reflects a portion of said applied RF power, comprising the steps of:

sensing the applied RF power furnished from said generator to the plasma chamber;

sensing the reflected RF power that is reflected back to said generator from said chamber;

measuring the magnitudes of said applied and reflected power at said frequency;

calculating a reflection coefficient RC at said frequency based on the ratio of said reflected power to said applied power;

calculating a VSWR equal to (VSWR)=(RC−1)/(RC+1); and adjusting the frequency of the generator in the direction to minimize said VSWR.

9. The method of claim 8, wherein said step of sensing said applied RF power comprises the step of sensing said reflected RF power substantially simultaneously with said step of said applied RF power.

10. Method of optimally tuning an RF generator to produce a plasma, wherein the generator applies RF power at a frequency in an RF range to a plasma chamber, wherein the plasma chamber reflects a portion of said applied RF power as reflected power, and wherein a relationship exists between a predetermined electrical parameter of said applied power and a predetermined electrical parameter of the reflected power, such that said relationship as a function of frequency that has a minimum or maximum value at an optimal tuning point in said RF range, the method comprising the steps of:

sensing said predetermined parameter of the applied RF power furnished from said generator to the plasma chamber;

sensing said predetermined parameter of the reflected RF power that is reflected back to said generator from said chamber;

calculating the magnitude of said relationship at said frequency;

adjusting the frequency of the generator in the direction towards said optimal tuning point.

11. Method of optimally tuning an RF generator according to claim 10, wherein said relationship is monotonically increasing between one end of said range to said optimal tuning point, and monotonically decreasing between the optimal tuning point and the other end of said range.

12. The method of claim 10, wherein said step of sensing said predetermined parameter of the applied RF power comprises the step of sensing said predetermined parameter of the reflected RF power substantially simultaneously with said step of sensing said predetermined parameter of the applied RF power.

* * * * *